United States Patent [19]

Maeda et al.

[11] Patent Number: 5,286,669
[45] Date of Patent: Feb. 15, 1994

[54] SOLID-STATE IMAGING DEVICE AND METHOD OF MANUFACTURING THE SAME

[75] Inventors: Toru Maeda, Kawasaki; Patsuzo Kawaguchi, Yokohama, both of Japan

[73] Assignee: Kabushiki Kaisha Toshiba, Kawasaki, Japan

[21] Appl. No.: 887,662

[22] Filed: May 26, 1992

Related U.S. Application Data

[62] Division of Ser. No. 547,050, Jul. 2, 1990, abandoned.

[30] Foreign Application Priority Data

Jul. 6, 1989 [JP] Japan ................................ 1-175171
Nov. 17, 1989 [JP] Japan ................................ 1-299251

[51] Int. Cl.$^5$ ............................................ H01L 21/339
[52] U.S. Cl. ............................................ 437/53; 437/50; 437/200
[58] Field of Search ................. 357/24, 24 LR, 24 M, 357/71, 71 S; 437/53, 50, 195, 196, 200, 949; 148/DIG. 22, DIG. 147; 257/216, 224, 233

[56] References Cited

U.S. PATENT DOCUMENTS

| | | | |
|---|---|---|---|
| 4,290,187 | 9/1981 | Stein | 357/24 |
| 4,337,476 | 6/1982 | Fraser et al. | 437/200 |
| 4,608,749 | 9/1986 | Harada et al. | 437/53 |
| 4,679,301 | 7/1987 | Blanchard et al. | 357/24 |
| 4,691,218 | 9/1987 | Boudewijns | 257/216 |
| 4,725,872 | 2/1988 | Blouke et al. | 357/24 M |
| 4,774,586 | 9/1988 | Koike et al. | 357/24 LR |
| 4,908,684 | 3/1990 | Koike et al. | 257/224 |
| 4,992,392 | 2/1991 | Nichols et al. | 437/53 |
| 5,028,972 | 7/1991 | Watanabe et al. | 257/233 |

FOREIGN PATENT DOCUMENTS

| | | | |
|---|---|---|---|
| 59-159564 | 9/1984 | Japan | 357/24 |
| 63-120463 | 5/1988 | Japan | 357/24 |
| 63-285969 | 11/1988 | Japan | 357/24 |
| 1-64355 | 3/1989 | Japan | 357/24 |
| 1-130562 | 5/1989 | Japan | 357/24 |
| WO88/07767 | 10/1988 | PCT Int'l Appl. | 357/24 |

OTHER PUBLICATIONS

Wolf et al., "Silicon processing for the VLSI Era", pp. 384–396, 1986.

Mochizuki Toru, Patent Abstracts of Japan, vol. 5, No. 103 (E-064), Jul. 3, 1981, "Manufacture of Semiconductor Device".

Ishikawa Onori, Patent Abstracts of Japan, vol. 11, No. 31 (E-475), Jan. 29, 1987, "Solid State Image Pick-Up Device and Manufacture".

Yasumi Miyagawa, Patent Abstracts of Japan, vol. 12, No. 369 (E-665), Oct. 4, 1988, "Solid-State Image Sensing Device".

Eiji Aramaki, Patent Abstracts of Japan, vol. 13, No. 114 (E-730), Mar. 20, 1989, "Solid-State Image Pick-Up Element".

*Primary Examiner*—Brian E. Hearn
*Assistant Examiner*—C. Chaudhari
*Attorney, Agent, or Firm*—Foley & Lardner

[57] ABSTRACT

The invention relates to a solid-state imaging device in which a light-sensitive element region and a charge transfer region are separately formed on a semiconductor substrate of a first conductivity type by implanting an impurity of a second conductivity type into the substrate. A channel region is formed between these two regions by implanting an impurity of the first conductivity type into the substrate. Next, charge transfer electrodes made of a light-proof material are formed on the light-sensitive element region and the charge transfer region, with insulating films thereunder.

An alloy of a high-melting-point metal and silicon is used in the construction of the charge transfer electrodes, and this alloy is subjected to high-temperature processing in an atmosphere of $O_2$.

1 Claim, 5 Drawing Sheets

SOLID-STATE IMAGING DEVICE AND METHOD OF MANUFACTURING THE SAME

This application is a division of application Ser. No. 07/547,050, filed Jul. 2, 1990, now abandoned.

The present invention relates to a solid-state imaging device and a method of manufacturing the same.

BACKGROUND OF THE INVENTION

Description of the Prior Art

The structure of a conventional solid-state imaging device will be described below with reference to the device shown in FIG. 5. First, a specific region of a semiconductor substrate (hereinafter abbreviated to substrate) 21 is implanted with an impurity of the same conductivity type as that of the substrate 21 to form an impurity region 22 that will isolate elements. Then, using an impurity of a different conductivity type from that of the substrate 21, a light-sensitive element region 23 and a charge transfer region 24 are separately formed in specific regions of the substrate 21. A channel region 25 implanted with a specific impurity is formed in the region of the substrate 21 between the regions 23 and 24. The structure of this channel region 25 is such that it determines the characteristics of a transistor formed by the substrate 21, regions 23 and 24, and an electrode 27a (described below).

Next, after an oxidation film 26a has been formed over the entire surface, a low-resistance polysilicon to which an impurity has been added is deposited thereon, and electrodes 27a and 27b are formed in the polysilicon by patterning. Subsequently, an insulation oxidation film 26b is formed over the top and sides of the low-resistance polysilicon by thermal oxidation.

Low-resistance polysilicon is then deposited and patterned to form electrodes 28a and 28b. After an insulating film 29 of, for instance, PSG, is formed thickly over the entire surface by a vapor growth method, a light-proof film consisting of aluminum is deposited thereon. Part of the light-proof film corresponding to the light-sensitive element region 23 is removed by patterning, exposing a hole portion corresponding to the light-sensitive element region 23 while leaving light-proof films 30a and 30b on the insulating film 29, covering the regions outside the portion corresponding to the light-sensitive element region 23.

In the solid-state imaging device constructed as described above, electric charge due to light incident on the hole portion defined by the light-proof films 30a and 30b is accumulated in the light-sensitive element formed by the substrate 21 and the light-sensitive element region 23. The transistor formed by the regions 23 and 24 and the electrode 27a operates so that the charge accumulated in the light-sensitive element is read out by the electrode 27a in the charge transfer region 24. A voltage differential is created between the electrodes 27a, 28a, 27b, and 28b, transferring the charge in sequence from right to left (as seen in the figure) within the charge transfer region 24.

Problems To Be Solved by the Present Invention

The above conventional solid-state imaging device has the following problems:

1. Since there is a lower limit on the resistance of the polysilicon used to form the electrodes 27a, 28a, 27b, and 28b that transfer the charge, it takes a long time to transfer a charge in a solid-state imaging device consisting of several elements.
2. Since the insulating film 29 isolating the electrodes 27a, 28a, 27b, and 28b from the light-proof films 30a and 30b is thick, unwanted light such as that incident at an angle through the hole in the light-proof film and reflected light can enter the charge transfer region 24 via the semi-transparent electrodes 27a, 28a, 27b, and 28b, without passing through the light-sensitive element region 23, causing smear noise that will also transfer charge.
3. The first layer of charge transfer electrodes 27a and 27b is insulated from the second layer of charge transfer electrodes 28a and 28b by the oxidation film 26a formed by thermal oxidation, but the dielectric strength of this oxidation film 26a is unstable, so variations in controllability can occur.

SUMMARY OF THE INVENTION

The present invention is designed to solve the above problems. It provides a solid-state imaging device that is both capable of high-speed operation and prevents the occurrence of smear noise, as far as is possible, and a manufacturing method that can produce such a solid-state imaging device.

According to a first invention, there is provided a method of manufacturing a solid-state imaging device which comprises the steps of:

forming a light-sensitive element region and a charge transfer region that are isolated from each other, by implanting into specific regions of a semiconductor device of a first conductivity type an impurity of a second conductivity type, and, in addition, forming a channel region by implanting an impurity of said first conductivity type into a region of said semiconductor substrate between said light-sensitive element region and said charge transfer region;

forming an insulation film over the entire surface of said semiconductor substrate;

forming first charge transfer electrodes by depositing a film including at least an alloy consisting of a high-melting-point metal and silicon over said insulating film formed on said semiconductor substrate, patterning said film of alloy, then subjecting said alloy to high-temperature processing in a specific atmosphere; and forming second charge transfer electrodes by depositing a film including at least an alloy consisting of a high-melting-point metal and silicon over said first charge transfer electrodes formed on said semiconductor substrate, patterning said film of alloy to form portions that partially overlap said first charge transfer electrodes, then subjecting said alloy to high-temperature processing in a specific atmosphere.

According to a second aspect of the present invention, there is provided a solid-state imaging device which comprises:

a solid-state imaging device having:

a light-sensitive element region and a charge transfer region formed by implanting into specific regions of a semiconductor substrate of a first conductivity type an impurity of a second conductivity type, said light-sensitive element region and said charge transfer region being isolated from each other;

a channel region formed by implanting an impurity of said first conductivity type between said light-sensitive element region and said charge transfer region; and charge transfer electrodes formed of a light-proof material including at least an alloy consisting of a high-melting point metal and silicon on said channel region and said charge transfer region, with an interlayer insulating material thereunder.

According to the method of manufacturing a solid-state imaging device of the present invention constructed as described above, first charge transfer electrodes are formed by subjecting the patterned film including at least the alloy of the high-melting-point metal and silicon to high-temperature processing in a specific atmosphere to turn into a silicide, then the top and sides of the film of the silicide of the high-melting-point metal are covered by an inter-layer insulating film made of $SiO_2$. The same process is repeated to form second charge transfer electrodes. Compared with conventional polysilicon electrodes, the electrodes formed in this way have a lower resistance and are impermeable to visible light, so the electrodes enable faster operation than conventional electrodes and, since the electrodes themselves act as a light-proof film, the electrodes can prevent the occurrence of smear noise, as far as is possible. In addition, since the $SiO_2$ interlayer insulation film between the first and second charge transfer electrodes, consisting of the alloy of a high melting point metal and silicon, has a two-layer structure, it is more stable than the conventional equivalent, so controllability of the solid-state imaging device is better.

According to the solid-state imaging device of the present invention, it is possible to provide a highly efficient solid-state imaging device which can operate at high speeds and prevent the occurrence of smear noise, as far as is possible, and which is also extremely controllable.

DESCRIPTION OF THE PREFERRED EMBODIMENTS

Figure 1A:
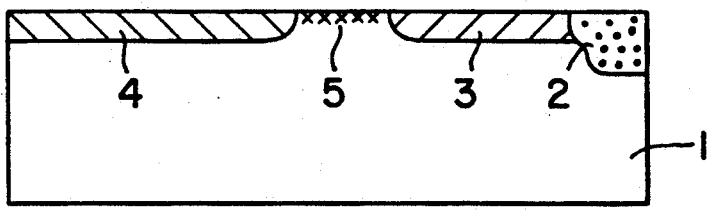
FIGS. 1A to 1D are sectional views showing the process of manufacturing the solid-state imaging device of the present invention.

The process of manufacturing the solid-state imaging device of the present invention is shown in FIGS. 1A through 1D. As shown in FIG. 1A, an impurity is implanted into specific regions of a semiconductor substrate (hereinafter abbreviated to substrate) 1 of a first conductivity type (for example, P-type) to form a light-sensitive element region 3 and a charge transfer region 4 of a second conductivity type (for example, N-type), and an impurity of the same conductivity type as the substrate 1 is implanted into the region surrounding the light-sensitive element region 3, except for a channel region 5 that will be described below, to form an element isolation region 2 to isolate adjacent elements. Then a specific impurity of the first conductivity type is implanted into the region of the substrate 1 between regions 3 and 4 to form the channel region 5 (see FIG. 1A).

Figure 1B:
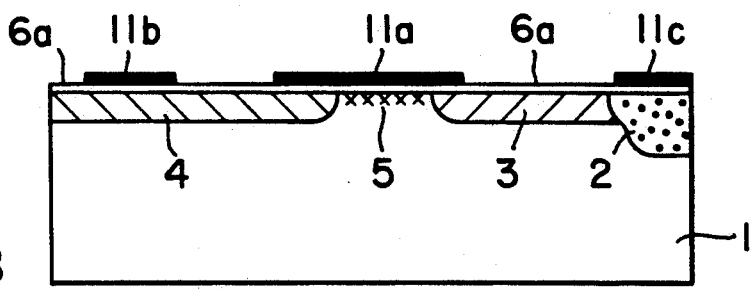
Figure 1C:
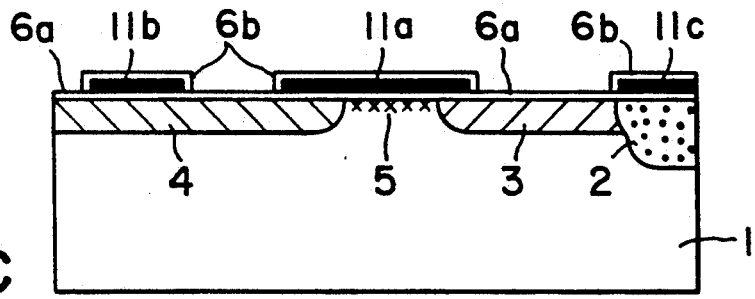

Next, after a gate oxidation film 6a is formed over the entire surface, a film formed from an alloy of tungsten and silicon is deposited and patterned to form charge transfer electrodes 11a and 11b and a light-proof film 11c (see FIG. 1B). The charge transfer electrodes 11a and 11b and the light-proof film 11c formed of this tungsten-silicon alloy are then subjected to high-temperature processing in an atmosphere of $O_2$ to turn the metal into its silicide, and an inter-layer insulation film 6b formed of $SiO_2$ is grown up on the top and sides of the processed charge transfer electrodes 11a and 11b and the light-proof film 11c (see FIG. 1C). Note that the component 11c on the element isolation region 2 is not used as an electrode; it functions as a light-proof film. Another film of tungsten-silicon alloy is then deposited and patterned to form a second layer of charge transfer electrodes 12a and 12b (see FIG. 1D). In the same way as with the first layer of charge transfer electrodes 11a and 11b, the second layer of charge transfer electrodes 12a and 12b is subjected to high-temperature processing in an atmosphere of $O_2$ to turn the metal of the electrodes 12a and 12b into its silicide and an inter-layer insulation film 6c formed of $SiO_2$ is grown up on the top and sides of the processed charge transfer electrodes 12a and 12b, then the solid-state imaging device is completed by forming wiring. Depending on the eventual application of the solid-state imaging device, a protecting film could subsequently be formed over the entire surface.

Instead of using a tungsten-silicon alloy as the material of the electrodes 11a, 11a', 11b, 11b', 11c, 11c', 12a, 12a', 12b and 12b', any high-melting-point metal silicide that has a low resistance and high heat tolerance can be used. In other words, in place of a tungsten-silicon alloy, a titanium-silicon, molybdenum-silicon alloy or tantalum-silicon alloy could be used.

In the above embodiment, the first layer of charge transfer electrodes 11a and 11b, and the second layer of charge transfer electrodes 12a and 12b are formed directly on top of the gate oxidation film 6a, but these layers could be formed by sequentially depositing and patterning a film for the electrode 11a of an alloy consisting of a high-melting-point metal (for example tungsten) and silicon, and a polysilicon film with an impurity oh top of the gate oxidation film 6a, as shown in FIGS. 2A–2D.

Figure 2A:
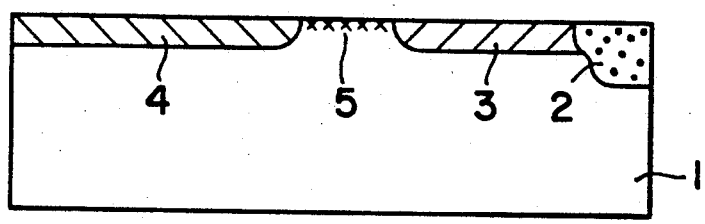
FIGS. 2A to 2D are sectional views showing another process of manufacturing the solid-state imaging device of the present invention.

In FIG. 2A, an impurity is implanted to a predetermined region of the substrate 1 of the first conductivity type (for example, P-type) to form the light-sensitive element region 3 of the second conductivity type (for example, N-type) and the charge transfer region 4 of the second conductivity type, and the element isolation region 2, which is formed by implanting an impurity having the same conductivity type as the substrate 1, is formed at the surrounding region in the light-sensitive region except the channel region to isolate adjacent elements. Then the specific impurity of the first conductivity type is implanted into the region of the substrate 1 between regions 3 and 4 to form the channel region 5.

Figure 2B:
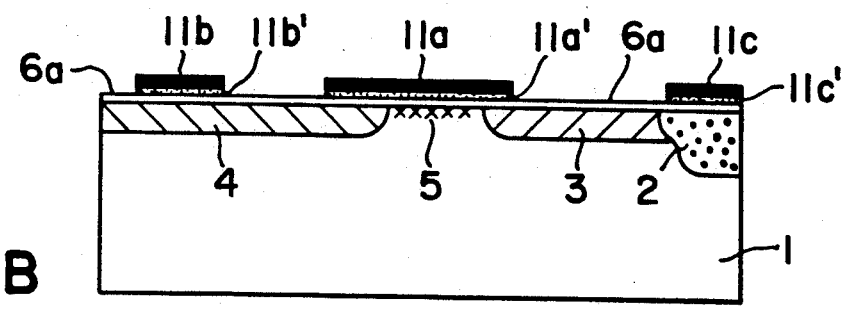
Figure 2C:
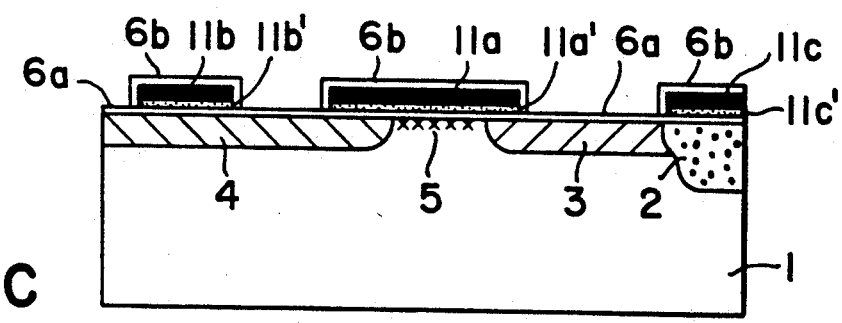

Next, after the gate oxidation film 6a is formed over the entire surface, the polysilicon film with the impurity and the film of the alloy consisting of tungsten and silicon are sequentially deposited and patterned to form the charge transfer electrodes 11a, 11a', 11b and 11b' and the light-proof films 11c and 11c' (see FIG. 2B). The charge transfer electrodes 11a and 11b and the light-proof film 11c formed of the tungsten-silicon alloy are then subjected to high-temperature processing in an atmosphere of $O_2$ to turn the metal into its silicide, and the inter-layer insulation film 6b formed of $SiO_2$ is grown up on the top and sides of the processed charge transfer electrodes 11a, 11b and the light-proof film 11c and the polysilicon films of the charge transfer electrodes 11a' and 11b' and the sides of the polysilicon film of the light-proof film 11c' (see FIG. 2C). Note that the component 11c on the element isolation region 2 is not used as an electrode; it functions as a light-proof film. Another polysilicon film with the impurity and another film of tungsten-silicon alloy are then deposited and patterned to form the second layer of the charge transfer electrodes 12a, 12a', 12b and 12b' on the charge transfer electrodes 11a, 11a', 11b and 11b' (see FIG. 2D).

In the same way as with the first layer of the charge transfer electrodes 11a, 11a', 11b and 11b', the second layer of the charge transfer electrodes 12a and 12b is subjected to high-temperature processing in an atmosphere of $O_2$ to turn the metal of the electrodes 12a and 12b into its silicide, and the inter-layer insulation film 6c formed of $SiO_2$ is grown up on the top and sides of the processed charge transfer electrodes 12a and 12b, then the solid-state imaging device is completed by forming wiring. An additional protecting film can be formed over the entire device depending upon its uses.

Figure 1D:
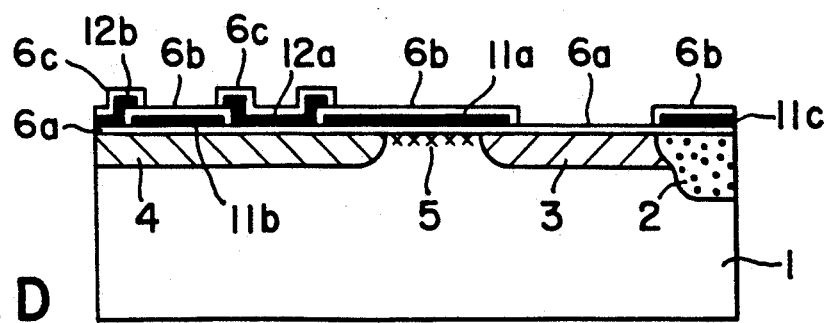
Figure 2D:
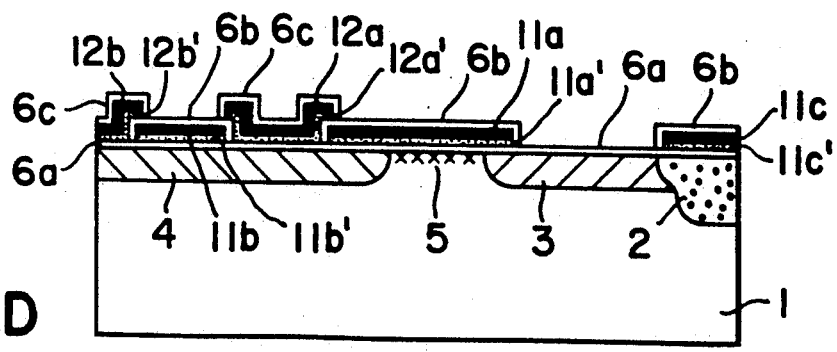
Figure 3:
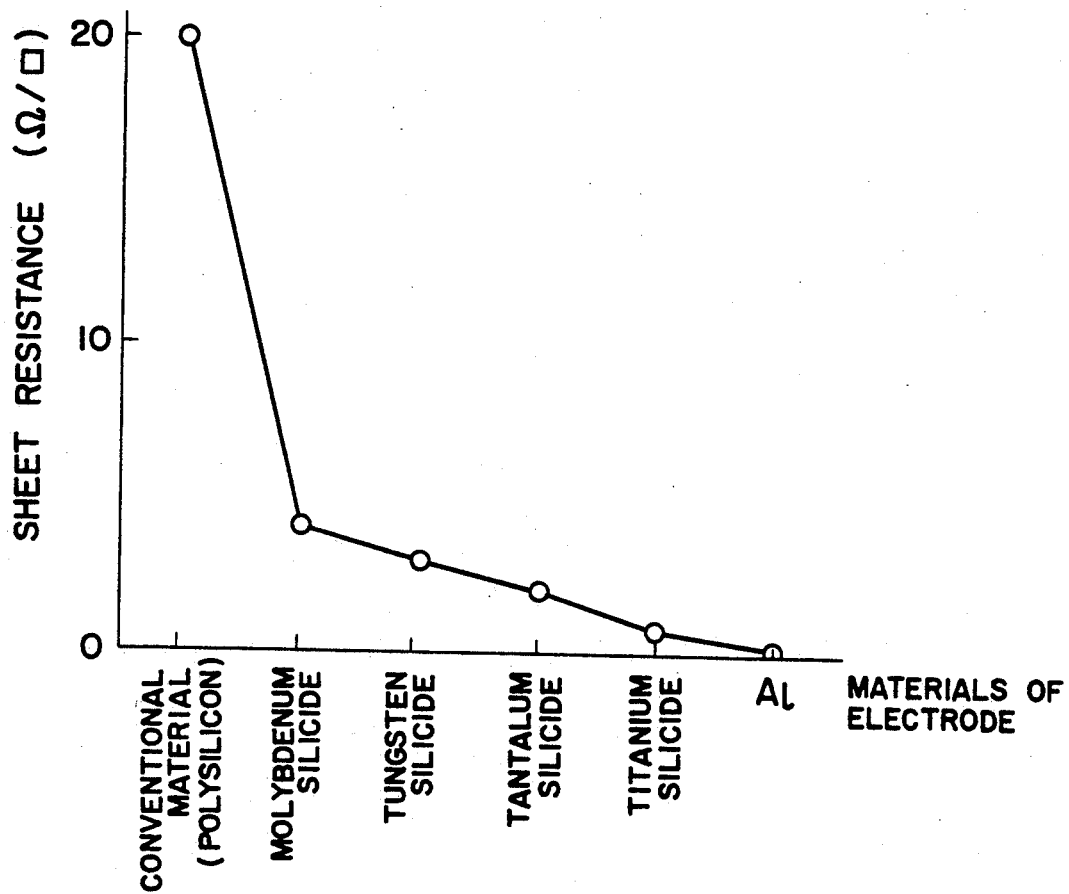
FIGS. 3 and 4 are graphs showing the effects of the solid-state imaging device of the present invention.
Figure 4:
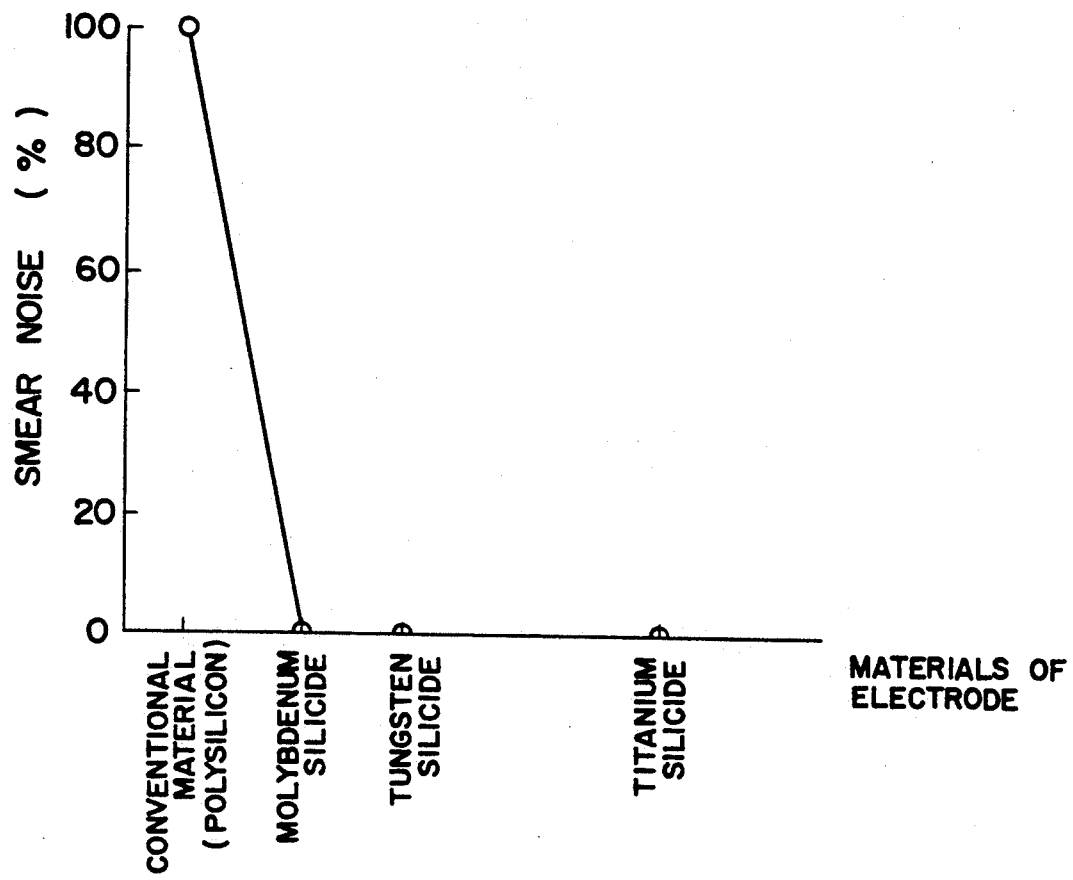
Figure 5:
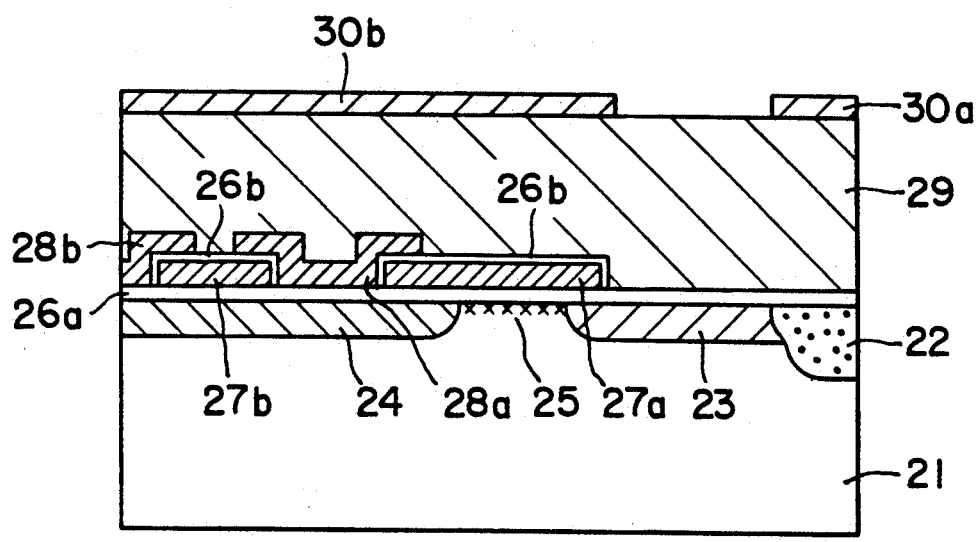
FIG. 5 is a sectional view of a conventional solid-state imaging device.

The solid-state imaging devices shown in FIGS. 1D and 2D and constructed as described above have the following advantages:

1. The resistance of the charge transfer electrodes can be reduced to one-fifth to one-twentieth that of a conventional device, as shown in FIG. 3, enabling high-speed operation.
2. The charge transfer electrodes themselves act as a light-proof film to block light, so that light can be completely prevented from shining on parts of the device outside the light-sensitive element, enabling the prevention of smear noise, as shown in FIG. 4.
3. Since the charge transfer electrodes 12a and 12b themselves form light-proof films, the special-purpose light-proof films 30a and 30b and the inter-layer insulating film 29 of the conventional solid-state imaging device are not necessary, reducing the number of construction steps required to two-thirds that of a conventional device, which can be expected to improve yield and reliability of the device.
4. Since the inter-layer insulation film 6b between the first layer of charge transfer electrodes 11a, 11a', 11b and 11b' and the second layer of charge transfer electrodes 12a, 12a', 12b and 12b' is formed as two layers, the device is more stable than a conventional device, and its controllability is better.

In the above embodiment, the light-sensitive element region 3 is formed before the charge transfer electrodes 11a, 11a', 11b, 11b', 12a, 12a', 12b and 12b' are formed, but it can also be formed by a self-alignment method after the charge transfer electrodes are formed.

With this structure, the individual charge transfer electrodes of the first layer are electrically connected to each other by the polysilicon, even if they should become damaged.

What is claimed is:

1. A method of manufacturing a solid-state imaging device comprising the steps of:

forming a light-sensitive element region and a charge transfer region that are isolated from each other, by implanting into specific regions of a semiconductor device of a first conductivity type an impurity of a second conductivity type, and forming a channel region by implanting an impurity of said first conductivity type into a region of said semiconductor substrate between said light-sensitive element region and said charge transfer region;

forming an insulation film over the entire surface of said semiconductor substrate;

forming first charge transfer electrodes by depositing a film including at least an alloy consisting of a high-melting-point metal and silicon over said insulating film formed on said semiconductor substrate, patterning said alloy film, then subjecting said alloy to high-temperature processing in an $O_2$ atmosphere; and forming second charge transfer electrodes by depositing a film, including at least an alloy formed of a high-melting-point metal and silicon, over said first charge transfer electrodes formed on said semiconductor substrate, patterning said alloy file to form portions that partially overlap said first charge transfer electrodes, then subjecting said alloy to high-temperature processing in an $O_2$ atmosphere.

* * * * *